United States Patent
Schwartz

(10) Patent No.: US 10,460,787 B1
(45) Date of Patent: Oct. 29, 2019

(54) SELECTION CIRCUIT USABLE WITH FERROELECTRIC MEMORY

(71) Applicant: Palo Alto Research Center Incorporated, Palo Alto, CA (US)

(72) Inventor: David E. Schwartz, Concord, MA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 15/981,564

(22) Filed: May 16, 2018

(51) Int. Cl.
G11C 11/22 (2006.01)

(52) U.S. Cl.
CPC ........ *G11C 11/2257* (2013.01); *G11C 11/221* (2013.01)

(58) Field of Classification Search
CPC .......................... G11C 11/2257; G11C 11/221
See application file for complete search history.

(56) References Cited

U.S. PATENT DOCUMENTS

| | | | |
|---|---|---|---|
| 5,589,847 A | 12/1996 | Lewis | |
| 6,459,110 B1 * | 10/2002 | Tani | G11C 11/22 257/295 |
| 6,510,073 B1 * | 1/2003 | Lee | G11C 11/22 257/295 |
| 6,614,678 B2 * | 9/2003 | Kato | G11C 11/22 365/145 |
| 6,859,381 B2 * | 2/2005 | Ohtsuka | G11C 11/22 257/E27.104 |
| 8,837,195 B2 | 9/2014 | Schwartz | |
| 9,613,676 B1 | 4/2017 | Wang et al. | |
| 9,786,345 B1 | 10/2017 | Thiruvengadam et al. | |
| 2016/0379703 A1 | 12/2016 | Schwartz et al. | |

FOREIGN PATENT DOCUMENTS

GB     2138207     10/1984

* cited by examiner

*Primary Examiner* — Pho M Luu

(74) *Attorney, Agent, or Firm* — Mueting, Raasch & Gebhardt

(57) ABSTRACT

A first thin-film transistor (TFT) communicatively couples a word line to a source signal in response to a selection signal applied to a first gate of the first TFT. The word line used to enable and disable a memory element that is coupled to the word line. A second TFT communicatively decouples the word line from a ground in response to the first signal being applied to a second gate of the second TFT.

20 Claims, 5 Drawing Sheets

SELECTION CIRCUIT USABLE WITH FERROELECTRIC MEMORY

This invention was made with government support under FlexTech RFP12-159 funded with assistance from the Army Research Lab. The government has certain rights in the invention.

SUMMARY

The present disclosure is directed to a selection circuit usable with ferroelectric memory. In one embodiment, a first thin-film transistor (TFT) communicatively couples a word line to a source signal in response to a selection signal applied to a first gate of the first TFT. The word line used to enable and disable a memory element that is coupled to the word line. A second TFT communicatively decouples the word line from a ground in response to the first signal being applied to a second gate of the second TFT.

In another embodiment, a memory circuit includes a plurality of ferroelectric memory cells. Each ferroelectric memory cell is coupled to one of a plurality of word lines and one of a plurality of bit lines. A plurality of selection circuits are between a source signal and the respective plurality of word lines. Each of the selection circuits includes a first thin-film transistor (TFT) that communicatively couples the word line to the source signal in response to a selection signal applied to a first gate of the first TFT. The word line is used to enable and disable the respective ferroelectric memory cells coupled to the word line. Each selection circuit also includes a second TFT that communicatively decouples the word line from a ground in response to the selection signal being applied to a second gate of the second TFT.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures. The drawings are not necessarily to scale.

DETAILED DESCRIPTION

The present disclosure relates to printed and/or organic circuits. Conventional electronics (e.g., integrated circuits) are formed by depositing and shaping (e.g., via photoresist) layers onto crystalline silicon wafers or similar semiconductor substrates. In contrast, a printed circuit can use a relatively lower-cost process (e.g., screen printing, inkjet printing) to form circuit elements on a substrate, typically a flexible film. Organic (e.g., carbon-based) materials are often used to form the circuit elements, although non-organic materials may also be used for some printed circuit elements.

One type of device that may use printed and/or organic circuits is ferroelectric (FE) memory. Ferroelectric memory is a non-volatile electric memory that stores information as remnant polarization in a ferroelectric material. A number of such FE materials exist such as poly(vinylidenefluoride-co-trifluoroethylene) or P(VDF-TrFE), which is a ferroelectric polymer. A bit is written to the memory by applying a bias across the FE material. A positive bias will write one value (e.g., a '1'), and a negative bias will write the other value (e.g., a '0'), although other conventions may be used, e.g., '0' and '1' for respective positive and negative bias.

To realize low-cost electronic systems, it is desirable to combine printed FE memory with printed circuits, for example circuits based on printed thin-film transistors (TFTs). Writing the FE memory can be accomplished, for example, by applying a high voltage pulse to one side of the memory cell (e.g., the "word line") while the other side of the memory cell (e.g., the "bit line") is connected to ground. To do this effectively for an array of memory cells, it is desirable to be able to have a single pulse-generation circuit which is selectively connected to one memory cell at a time. Each memory cell can be individually enabled to receive the write pulse by an "enable" control signal (EN).

Organic TFTs have characteristics that differ from conventional crystalline silicon (c-Si) based electronics. For example, the carrier mobilities of organic TFTs are much lower, leading to much higher channel resistances. In addition, the on/off ratios of organic TFTs—ratios between the current magnitude in the "on" and "off" states—when operated in the limited voltage ranges, such as 0 V to 5 V or 0 V to 20 V, can be much lower than inorganic transistors, in some cases as low as 500 or even less, especially when the TFTs are operated at lower voltage ranges. In contrast, c-Si MOSFETs can have on/off ratios of $10^8$ at their operating voltage ranges. In addition, when printing techniques are used for device fabrication, yield can be low, indicating the need for circuits with as few TFTs as possible.

Figure 1:
FIGS. 1 and 2 are circuit diagrams of conventional transistor gating arrangements.
Figure 2:
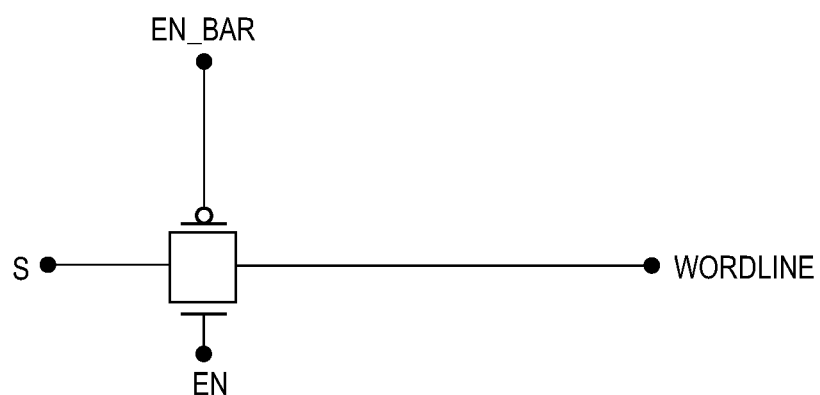

Conventional FE memory cell gating may use a pass transistor as shown in FIG. 1 or a transmission gate as shown in FIG. 2. For the pass transistor of FIG. 1, the source signal (S) is passed to the word line when the inverse of the enable signal (EN_BAR) is low. For the transmission gate in FIG. 2, S is passed to the word line when EN is high and EN_BAR is low. The topologies in FIGS. 1 and 2 selectively connect an input to an output via a single transistor (pass transistor) or pair of complementary transistors (transmission gate). When an input is not selected, the transistor, or pair of transistors, is "off" and presents a relatively high impedance to the output. However, this system requires that the transistors have high on/off ratios. With low on/off ratios the impedance in the "off" state may not be sufficiently high to fully block the signal, and input signal pulses leak through to unselected memory cells, potentially disturbing their stored values. Additionally, the transmission gate will have additional circuitry and signal lines to simultaneously provide a pair of complementary enable signals, EN and EN_BAR, as opposed to a single EN or EN_BAR signal line.

Figure 3:
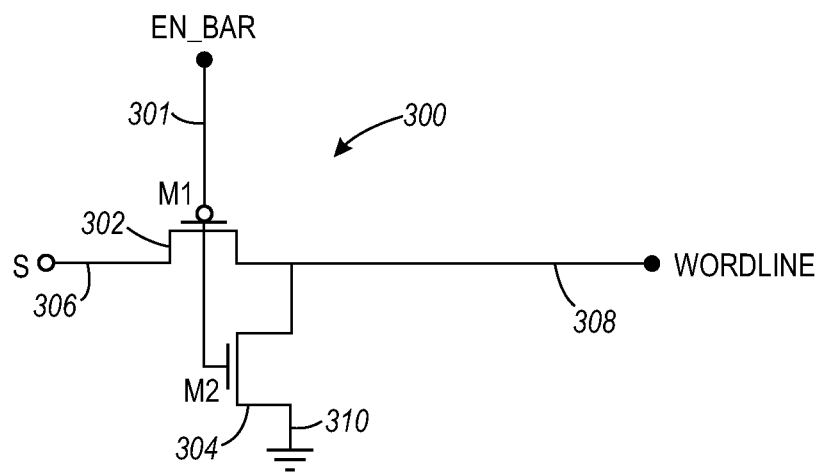
FIG. 3 is a schematic diagram of a selection circuit according to an example embodiment.

In reference now to FIG. 3, a circuit diagram shows a selection circuit 300 according to an example embodiment. The circuit can be used to enable and disable any type of circuit element. A circuit element coupled to the word line 308 is enabled when selection/enable input signal 301

(EN_BAR), which is coupled to gates of TFTs 302, 304 is low. When EN_BAR 301 is low (enabling the switched circuit element), the p-type TFT 302 (M1) between the source (S) 306 and the word line 308 is in a low-impedance state, which couples S 306 to the word line 308. When EN_BAR 301 is low (enabling the circuit element), the n-type TFT 304 (M2) is in a high-impedance state, decoupling the word line 308 from ground 310. When EN_BAR 301 is high (disabling the circuit element), the p-type TFT 302 is in a high-impedance state, decoupling S 306 from the word line 308, and the n-type TFT 304 is in a low-impedance state, coupling the word line 308 to the ground 310. One advantage of this circuit is that it only requires a single control signal (EN_BAR). A second advantage of this circuit is that when the memory cell is disconnected from the signal S, it is actively connected to ground, limiting disturbance of the memory cell from changes in S.

Figure 4:
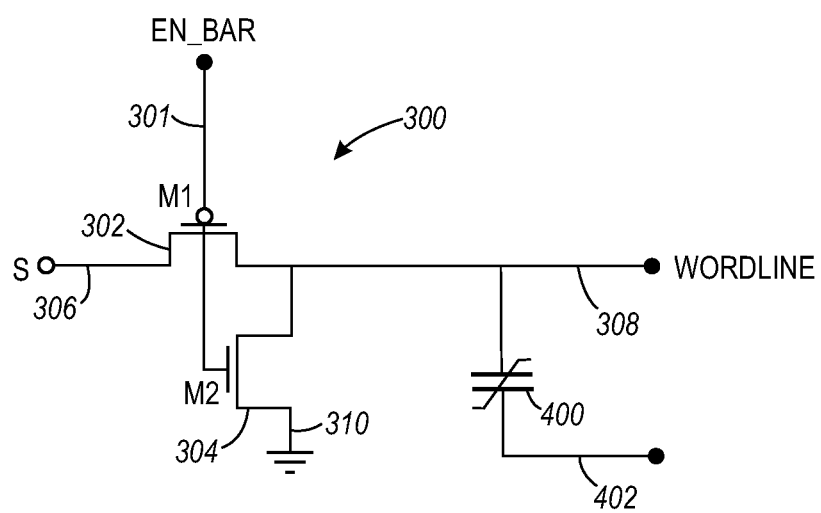
FIG. 4 is a schematic diagram of a ferroelectric memory selection arrangement according to an example embodiment.

In FIG. 4, the selection circuit 300 is shown coupled to a FE memory element 400, which in this case is the switched circuit element. The selection circuit 300 causes source S to be applied to one side of the FE memory element 402, while another signal (not shown) is applied to a bit line 402 on the other side of the memory element 304. A selection circuit (not shown) similar to circuit 300 may also be used to control the bit line 402. When both selection circuits are activated, the FE memory element 400 can be written to and read from by the appropriate circuitry coupled to the bit line 402 and word line 308.

Figure 5:
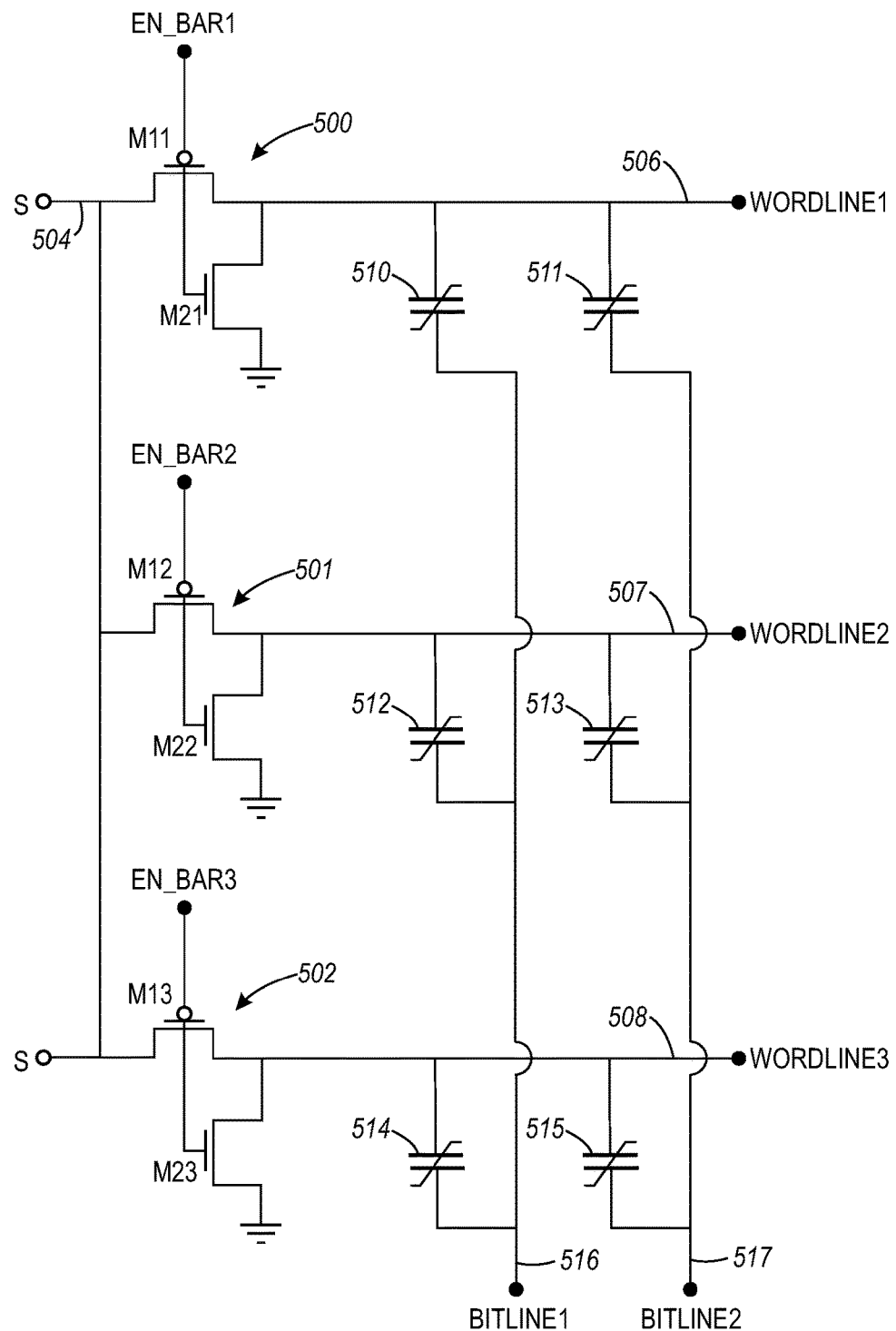
FIG. 5 is a schematic diagram of a ferroelectric memory selection array according to an example embodiment.

In FIG. 5, a schematic diagram illustrates multiple selection circuits 500-502 coupled in parallel to a common source line 504 and operable to control respective FE memory cells 510-515. Note that while three selection circuits 500-502 and six FE memory cells 510-515 are shown here, this may be extended to any number of selection circuits and memory cells, and the selection circuits 500-502 may be used with selectable circuit elements other than FE memory cells. Each of the selection circuits 500-502 couples the common signal line 504 to respective word lines 506-508 when selection signals (in this case EN_BAR1 to EN_BAR3) are set to a low voltage. For example, if EN_BAR1 is set to apply a low voltage to the gate of TFT M11, TFT M11 is enabled, connecting S to WORDLINE 1, and selecting FE memory cells 511 and 512, while TFT M21 is disabled and presents a high impedance between WORDLINE 1 and ground. If the selection signals EN_BAR1, EN_BAR2, etc., are set to a high value, selection circuits 500-502 have a high impedance through M11, M12, etc., and a low impedance through M21, M22, etc., which connect the respective word lines 506-508 to ground. For example, if EN_BAR1 is set to a high voltage, TFT M11 is disabled, presenting a high impedance between S and WORDLINE 1, while TFT M21 is enabled and presents a low impedance between WORDLINE 1 and ground, effectively tying WORDLINE 1 to ground. This active grounding reduces the leakage through the off-select TFT M21 and reduces undesired disturbing of unselected memory cell contents.

Memory cells 510-515 are coupled between respective word lines 506-508 and bit lines 516-517. Any individual memory cell 510-515 can be selected for reading or writing by activating the appropriate combination of word lines 506 and bit lines 516-518. During writing, word lines 506 and bit lines 516-518 apply voltages to the cells 510-515 to write desired bit of data. During reading, word lines 506 and bit lines 516-518 couple a sensor to the cells 510-515 to read the written bits of data. As noted above, selection circuits similar to circuits 500-502 may be used to activate the individual bit lines 516-518. Note that while bit lines 516-518 are coupled to multiple memory cells 510-515, each of the memory cells 510-515 may have a separate, dedicated bit line.

Generally, tying disabled word lines 506-508 to ground through M21, M22, etc., of each selection circuit 500-502 reduces susceptibly to feedthrough of the S signal to memory cells 510-515. Neither pass transistors nor transmission gates have this feature. Unlike transmission gates which require two complementary signals, a single enable signal (EN_BAR) can be used for each selection circuit 500-502. In general, using organic or printed TFTs in circuits as shown in FIGS. 3-5 has an additional advantage if the memory cell is also to be connected to a separate reader or read/write unit made from conventional electronics. Because the on-state conductance of the organic or printed TFTs is low relative to the conductance of a c-Si MOSFET, the circuit will not load the external reader whether it is in the on or off state.

Figure 6:
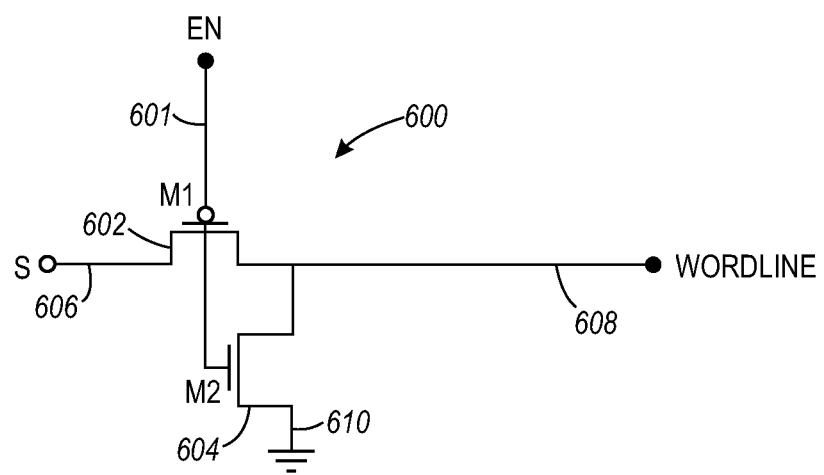
FIG. 6 is a schematic diagram of a selection circuit according to another example embodiment.

In reference now to FIG. 6, a circuit diagram shows a selection circuit 600 according to another example embodiment. The cell is enabled when selection/enable signal 601 (EN) applied to the gates of TFTs 602, 604 is low. When EN 601 is high, the n-type TFT 602 (M1) between the signal 606 and the word line 608 is in a low-impedance state, which couples the source 606 to the word line 608. When EN 601 is high, the p-type TFT 604 (M2) is in a high-impedance state, decoupling the word line 608 from ground 610. When EN 601 is low, the n-type TFT 602 is in a high-impedance state, decoupling the source 606 from the word line 608, and the p-type TFT 604 is in a low-impedance state, coupling the word line 608 to the ground 610.

Figure 7:
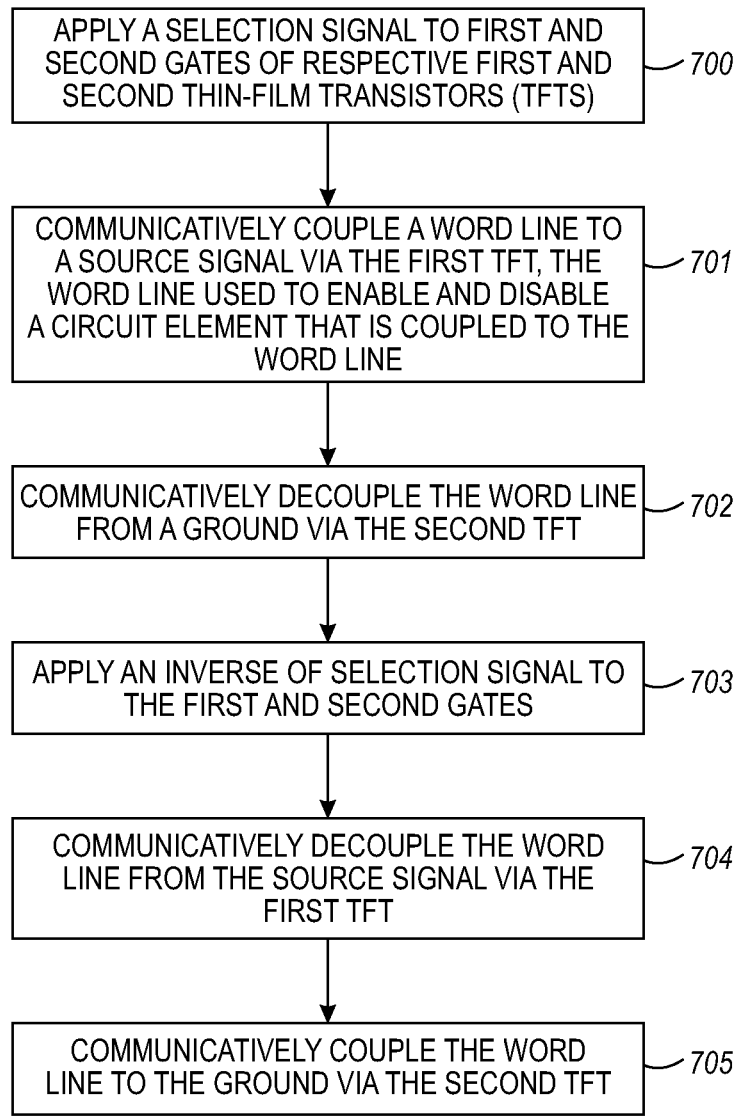
FIG. 7 is a flowchart of a method according to an example embodiment.

In FIG. 7, a flowchart shows a method according to an example embodiment. The method involves applying 700 a selection signal to first and second gates of respective first and second TFTs. In response to the selection signal, a word line is communicatively coupled 701 to a source signal via the first TFT. The word line used to enable and disable a circuit element that is coupled to the word line. Also in response to the selection signal, the word line is communicatively decoupled 702 from a ground via the second TFT. An inverse of the selection signal is applied 703 to the first and second gates. In response to the inverse of the selection signal being applied, the word line is communicatively decoupled 704 from the source signal via the first TFT and the word line is communicatively coupled 705 to the ground via the second TFT Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A selection circuit, comprising:
a first thin-film transistor (TFT) that communicatively couples a word line to a source signal in response to a selection signal applied to a first gate of the first TFT, the word line used to enable and disable a memory element that is coupled to the word line; and
a second TFT that communicatively decouples the word line from a ground in response to the selection signal being applied to a second gate of the second TFT, the first and second gates being connected together to a line that provides the selection signal.

2. The selection circuit of claim 1, wherein, in response to an inverse of the selection signal being applied to the first and second gates:
the first TFT communicatively decouples the word line from the source voltage; and
the second TFT communicatively couples the word line to the ground to limit disturbance of the memory element from changes in the source voltage.

3. The selection circuit of claim 1, wherein:
the first TFT comprises a p-type transistor;
the second TFT comprises an n-type transistor; and
the selection signal is a low voltage.

4. The selection circuit of claim 1, wherein:
the first TFT comprises a n-type transistor;
the second TFT comprises an p-type transistor;
the selection signal is a high voltage.

5. The selection circuit of claim 1, wherein the memory element comprises a ferroelectric memory cell.

6. The selection circuit of claim 5, wherein the ferroelectric memory cell comprises a printed ferroelectric memory cell.

7. The selection circuit of claim 1, wherein the first and second TFTs are organic TFTs.

8. The selection circuit of claim 1, wherein the first and second TFTs are printed TFTs.

9. The selection circuit of claim 1, wherein the first and second TFTs have an on/off current ratios of 500 or less.

10. A memory circuit, comprising:
a plurality of ferroelectric memory cells, each ferroelectric memory cell coupled to one of a plurality of word lines and one of a plurality of bit lines;
a plurality of selection circuits between a source signal and the respective plurality of word lines, each of the selection circuits comprising:
a first thin-film transistor (TFT) that communicatively couples the word line to the source signal in response to a selection signal applied to a first gate of the first TFT, the word line used to enable and disable the respective ferroelectric memory cells coupled to the word line; and
a second TFT that communicatively decouples the word line from a ground in response to the selection signal being applied to a second gate of the second TFT, the first and second gates being connected together to a line that provides the selection signal.

11. The memory circuit of claim 10, wherein, in response to an inverse of the selection signal being applied to the first and second gates:
the first TFT communicatively decouples the word line from the source voltage; and
the second TFT communicatively couples the word line to the ground to limit disturbance of the memory element from changes in the source voltage.

12. The memory circuit of claim 10, wherein the ferroelectric memory cells comprise printed ferroelectric memory cells.

13. The memory circuit of claim 10, wherein the first and second TFTs are organic TFTs.

14. The memory circuit of claim 10, wherein the first and second TFTs are printed TFTs.

15. The memory circuit of claim 10, wherein the first and second TFTs have an on/off current ratio of 500 or less.

16. A method, comprising:
applying a selection signal to first and second gates of respective first and second thin-film transistors (TFT), the first and second gates being connected together to a line that provides the selection signal;
in response to the selection signal:
communicatively coupling a word line to a source signal via the first TFT, the word line used to enable and disable a memory element that is coupled to the word line; and
communicatively decoupling the word line from a ground via the second TFT.

17. The method of claim 16, further comprising:
applying an inverse of the selection signal to the first and second gates; and
in response to the inverse of the selection signal being applied, communicatively decoupling the word line from the source signal via the first TFT and communicatively coupling the word line to the ground via the second TFT to limit disturbance of the memory element from changes in the source voltage.

18. The method of claim 16, wherein the memory element comprises a printed ferroelectric memory cell.

19. The method of claim 16, wherein the first and second TFTs are printed, organic TFTs.

20. The method of claim 16, wherein the first and second TFTs have an on/off current ratios of 500 or less.

* * * * *